(12) United States Patent  
Lundahl

(10) Patent No.: US 9,449,214 B2  
(45) Date of Patent: Sep. 20, 2016

(54) FINGERPRINT SENSING DEVICE WITH PROTECTIVE COATING

(71) Applicant: Fingerprint Cards AB, Göteborg (SE)

(72) Inventor: Karl Lundahl, Göteborg (SE)

(73) Assignee: FINGERPRINT CARDS AB, Göteborg (DE)

( * ) Notice: Subject to any disclaimer, the term of this patent is extended or adjusted under 35 U.S.C. 154(b) by 0 days.

(21) Appl. No.: 14/894,162

(22) PCT Filed: Jul. 1, 2014

(86) PCT No.: PCT/SE2014/050830  
§ 371 (c)(1),  
(2) Date: Nov. 25, 2015

(87) PCT Pub. No.: WO2015/005851  
PCT Pub. Date: Jan. 15, 2015

(65) Prior Publication Data  
US 2016/0125220 A1    May 5, 2016

(30) Foreign Application Priority Data

Jul. 11, 2013 (EP) .................................. 13176103

(51) Int. Cl.
```
G06K 9/20     (2006.01)
G06K 9/00     (2006.01)
H01L 23/00    (2006.01)
H01L 23/28    (2006.01)
H01L 23/31    (2006.01)
G06K 7/08     (2006.01)
H01L 23/26    (2006.01)
```

(52) U.S. Cl.  
CPC ............. *G06K 9/00053* (2013.01); *G06K 7/08* (2013.01); *G06K 9/0002* (2013.01); *G06K 9/00006* (2013.01); *G06K 9/00013* (2013.01); *G06K 9/20* (2013.01); *G06K 9/209* (2013.01); *H01L 23/26* (2013.01); *H01L 23/28* (2013.01); *H01L 23/3178* (2013.01); *H01L 23/562* (2013.01); *H01L 23/564* (2013.01)

(58) Field of Classification Search  
USPC .................. 382/124–127, 312; 345/173, 174  
See application file for complete search history.

(56) References Cited

U.S. PATENT DOCUMENTS 6,411,726 B1 *  6/2002  Pires .................. G06K 9/00053  
                                                        382/124  
6,515,488 B1 *  2/2003  Thomas ............. G06K 9/00053  
                                                        324/662

(Continued)

FOREIGN PATENT DOCUMENTS

EP       1316912 A2    6/2003  
JP       2002071307 A  3/2002

OTHER PUBLICATIONS

International Search Report and Written Opinion for International Application No. PCT/SE2014/050830 mailed Nov. 20, 2014, 10 pages.

*Primary Examiner* — Eric Rush  
(74) *Attorney, Agent, or Firm* — Remarck Law Group PLC

(57) ABSTRACT

A sensing device comprising a plurality of sensing elements, each of the sensing elements being configured to provide a signal indicative of an electromagnetic coupling between the sensing element and a finger placed on a surface of the sensing device, a first layer arranged to cover the plurality of sensing elements, the first layer comprising a plurality of recesses, and a second layer arranged to cover the first layer, the second layer having hydrophobic surface properties. There is also provided a method for manufacturing such a sensing device.

15 Claims, 4 Drawing Sheets

(56) References Cited

U.S. PATENT DOCUMENTS

| | | | |
|---|---|---|---|
| 6,762,470 B2 * | 7/2004 | Siegel | G06K 9/00053 382/124 |
| 7,960,826 B2 * | 6/2011 | Lin | H01L 21/3105 257/635 |
| 8,175,344 B2 * | 5/2012 | Funahashi | G06K 9/00114 382/124 |
| 2007/0222010 A1 | 9/2007 | Chou et al. | |
| 2012/0170819 A1 * | 7/2012 | Kiyomoto | G06K 9/00053 382/124 |

* cited by examiner

FINGERPRINT SENSING DEVICE WITH PROTECTIVE COATING

CROSS-REFERENCE TO RELATED APPLICATIONS

This application is a 371 U.S. National Stage of International Application No. PCT/SE2014/050830, filed Jul. 1, 2014, which claims priority to EP Application No. 13176103.3, filed on Jul. 11, 2013. The disclosure of each of the above applications is incorporated herein by reference in their entirety.

FIELD OF THE INVENTION

The present invention relates to a sensing device. More particularly, the present invention relates to a device for sensing fingerprints, and the affiliated protective coating layer of such device.

TECHNICAL BACKGROUND

As the development of biometric devices for identity verification, and in particular of fingerprint sensing devices, has lead to devices which are made smaller, cheaper and more energy efficient, the possible applications for such devices are increasing.

In particular fingerprint sensing has been adopted more and more in, for example, consumer electronic devices, due to small form factor, relatively beneficial cost/performance factor and high user acceptance (in particular in comparison to retina scanning etc).

Capacitive fingerprint sensing devices, built based on CMOS technology for providing the fingerprint sensing elements and auxiliary logic circuitry, are increasingly popular as such sensing devices can be made both small and energy efficient while being able to identify a fingerprint with high accuracy. Thereby, capacitive fingerprint sensors are advantageously used for consumer electronics, such as portable computers, tablets and mobile phones.

However, capacitive fingerprint sensing devices are typically sensitive to contaminants located between the capacitive sensing elements of the sensor and the finger to be measured. Contaminants may be introduced from the ambient, such as e.g. moisture from the air, or from the surface of a person's fingertip (such as e.g sweat, hand lotion etc). For example, residual fingerprints on the sensing surface may reduce the accuracy of the sensing device, and may in worst case lead to erroneous readings. Contaminants on the sensing surface located such that they span across boundaries between sensing elements may for example lead to a coupling between adjacent sensing elements, which in turn reduces the accuracy of the sensing device.

Accordingly, it is desirable to reduce the occurrence of contaminants on the sensing surface of a capacitive fingerprint sensing device To address the presence of contaminants, U.S. Pat. No. 7,071,708 discloses a chip type sensor, which may be a capacitive fingerprint sensor, having a protection layer comprising a polymeric material or ceramic atomic layer to provide a hydrophobic and lipophobic surface. The purpose of the protective layer is to prevent a latent fingerprint from being formed on the surface.

However, materials which are hydrophobic and/or lipophobic, also referred to as easy-to-clean materials, are typically sensitive to mechanical abrasion and daily wear and tear. Under the influence of abrasive action, they are either physically removed or lose the easy-to-clean properties, which chemically may only be attributed to the very few first nanometers of the surface. This imposes problems of utilizing such materials for fingerprint sensors, since the easy-to-clean properties will degrade with normal usage of the sensor over time. This is particularly problematic for swipe sensors where the user is required to slide the fingertip over the sensor surface.

SUMMARY OF THE INVENTION

In view of the above-mentioned desired properties of a fingerprint sensing device, and the above-mentioned and other drawbacks of the prior art, it is an object of the present invention to provide an improved fingerprint sensing device which maintain "easy to clean" properties even after exposure to excessive abrasive action such as e.g. resulting from daily use of the sensor for long time periods.

According to a first aspect of the present invention, it is therefore provided a sensing device comprising a plurality of sensing elements, each of the sensing elements being configured to provide a signal indicative of an electromagnetic coupling between the sensing element and a finger placed on a surface of the sensing device, a first layer arranged to cover the plurality of sensing elements, the first layer comprising a plurality of recesses, and a second layer arranged to cover the first layer, the second layer having hydrophobic surface properties.

It is, furthermore, provided a fingerprint sensing device comprising: an array of sensing elements, each of the sensing elements being configured to provide a signal indicative of an electromagnetic coupling between the sensing element and a finger placed on a surface of the fingerprint sensing device; a first dielectric layer arranged to cover the array of sensing elements, the first dielectric layer comprising a plurality of recesses at a top surface of the first dielectric layer, the recesses being distributed across the array of sensing elements with a spacing between adjacent ones of the recesses being less than 400 µm; and a top hydrophobic layer arranged on the top surface of the first dielectric layer, in the recesses and between the recesses, to provide the surface of the sensing device on which the finger is placed, such that when the top hydrophobic layer is worn away through use of the fingerprint sensing device, hydrophobic material will remain in the recesses where it is protected from wear and tear.

The sensing device should be understood to further comprise sensing circuitry connected to the sensing elements for reading a signal from the sensing elements. The sensing circuitry may in turn comprise or be connected to readout circuitry for providing a result of the sensing device to an external device for further processing.

The recesses of the first layer are formed in the first layer without penetrating through the first layer, meaning that they do not reach through to the sensing element covered by the first layer.

Hydrophobic surface properties should in the present context be understood as a surface which in general repels water. The hydrophobic surface may for example be achieved by incorporating fluorine functional groups on a polymer or ceramic backbone structure or by utilizing a polymer which intrinsically contains fluorine in the main polymer chain, such as e.g. Polytetrafluoroethylene (PTFE), in the second layer. The second layer is the surface layer of the sensing device and may also be referred to as a top coating.

The present invention is based on the realization that when the top hydrophobic layer of the sensing device is worn away, the hydrophobic material will remain in the recesses where it is protected from wear and tear, for example from a finger being swept over the surface of a fingerprint sensing device. Thereby, the hydrophobic material remaining in the recesses will prevent the formation of a continuous film of contaminants, such as drops of sweat, across the recess. Instead, contaminants located on the surface will be broken up into smaller portions by means of the recesses, thereby reducing the risk that a continuous film is formed across the boundary between adjacent sensing elements, which in turn, reduces the occurrence of coupling between adjacent sensing elements. If a contaminant is present on the surface of the sensing device, there is a risk that the contaminant fills or partially fills the valley of a finger in contact with the surface, which in turn may result in that it is not possible to distinguish the valley, thereby reducing the accuracy of the sensing device. In other words, a contaminant located in a valley of a finger may provide the same coupling to the sensing element as the finger does, and may therefore be seen by the sensing element as a part of the finger. A contaminant located in the valley of a finger may thus act as a "short circuit" between adjacent ridges of the finger. As the hydrophobic material in the recesses will act to prevent the formation of continuous films of contaminants, the occurrence of surface portions of the sensing device where sufficiently large amounts of contaminants is present to fill the valley of a finger will be reduced. Thus, the risk of "short circuit" between adjacent ridges, or between a ridge and a valley is reduced. Accordingly, the sensing device according to the present invention is less sensitive to contamination after the top hydrophobic coating has been worn away. Thereby, a more reliable sensing device is provided which is more resistant to wear and tear, and which may operate also under conditions of sever contamination when its top coating has been (partially) worn away. Depending on the application, the specific size shape and arrangement of recesses may vary depending on for example the configuration of the sensing elements.

Furthermore, if recesses are arranged such that they limit movement of a contaminant across recesses, a contaminant may be guided away from a sensing element towards the edge of the device by said recesses. Thereby, the recesses may have an advantageous effect also before the top layer has been worn away.

Moreover, the first layer is preferably made to be more resistant to abrasive or other mechanical wear and tear compared to the second layer, so that even if portions or all of the second layer is worn away, the first layer will be more durable.

According to one embodiment of the invention, a thickness of the second layer may advantageously be lower than a maximum depth of the recess. Thereby, the surface of the sensing device, i.e. the sensing surface will also have topography in the form of recesses corresponding to the recesses of the first layer. As a result, contaminants may for example gather in the recesses such that they may be guided away from the sensing surface more easily. However, it is also possible to provide a second layer which is considerably thicker than the depth of the recess such that a substantially planar sensing surface is provided.

In one embodiment of the invention, the depth of the recess may be in the range of 1-50 μm. Accordingly, the first dielectric layer may advantageously have a thickness of at least 50 μm. Moreover, each of said recesses may advantageously be at least 5 μm deep to better protect portions of the top hydrophobic layer in the recesses from wear and tear. It should be noted that to form recesses that are more than, say, 1 μm deep, it may be necessary to remove material from the first dielectric layer.

In one embodiment of the invention, the recesses may be substantially circular. Circular recesses can easily be formed in a suitable pattern to prevent the formation of too large areas of continuous films of contaminants on the sensing surface. However, the shape of the recess may in principle be any shape such as a square, ellipsoid, polygon or free form shape.

According to one embodiment of the invention, the recesses may advantageously be provided in the form of a plurality of elongated grooves, each groove extending at least a distance corresponding to a side of a sensing element. Thereby, the grooves may prevent a continuous film of contaminants from forming which reaches across more than one boundary between adjacent sensing elements. The terms groove, trench or elongate recess may be considered to have the same meaning within the present context.

In one embodiment of the invention, the recesses may advantageously be arranged in alignment with boundaries between said sensing elements. By locating recesses in the form of groves or trenches in direct alignment with the boundaries between the sensing elements, the occurrence of a continuous film of contaminant across the boundary is reduced.

According to one embodiment of the invention, a distance between adjacent recesses may advantageously be less than 400 μm. As the ridge of a finger is typically approximately in the range of 200-400 μm, it is desirable to have a distance between adjacent recesses which is less than the distance between two ridges such that a continuous film located between two ridges is interrupted at least at one location between the ridges.

In one embodiment of the invention, a minimum width of the recess is at least 10 μm. That the minimum width is at least 10 μm means that the width of the recess, as seen from above, is at 10 μm or more at the place where it is most narrow. For a circular recess, the diameter would be at least 10 μm and for a quadratic or rectangular recess, the length of the shortest side would be at least 10 μm. A certain minimum width of the recess is required so that it may prevent the formation of a continuous film of a contaminant. If the width is too small, a contaminant may form a continuous film over the recessed portion. Furthermore, the sidewalls of the recess may be vertical or they may be inclined, for example so that a shallow bowl-like recess is formed.

According to one embodiment of the invention, the recesses may be provided as a grid of continuous grooves extending across said sensing device, said grooves being aligned with boundaries between said sensing elements. By forming a grid-like recess pattern corresponding to the boundaries between sensing elements it is ensured that there is a recessed portion at every boundary between adjacent sensing elements. Furthermore the sensing elements of a sensing device are typically arranged in a regular array configuration.

In one embodiment of the invention, the second layer may advantageously have oleophobic surface properties. It is advantageous to prevent as much as possible of possible contaminants from adhering to the sensing surface of the sensing device. Therefore, the top layer forming the sensing surface may preferably have surface properties such that several different substances are repelled. An oleophobic surface may also be referred to as lipophobic. Furthermore, a surface which is both hydrophobic and oleophobic is sometimes referred to as omniphobic.

According to one embodiment of the invention, a thickness of the second layer is preferably less than 100 nm. The thickness of the second layer is inversely related to the coupling between an object place placed on the sensing surface and the sensing element. Accordingly, a thinner second layer leads to a higher sensitivity of the sensing device.

In one embodiment of the invention, the first layer may be a dielectric layer. Furthermore, the sensing element may be a capacitive sensing element being configured to provide a signal indicative of a capacitive coupling between said sensing element and a finger placed on a surface of the sensing device.

According to a second aspect of the invention, there is provided a method for manufacturing a sensing device, said method comprising: providing a substrate; forming a plurality of sensing elements on said substrate; providing a first layer covering said sensing elements; forming a plurality of recesses in said first layer; and providing a second layer covering said first layer, said second layer having hydrophobic surface properties.

Furthermore, it is provided a method for manufacturing a fingerprint sensing device, the method comprising: providing a substrate comprising a plurality of sensing elements on a top surface of the substrate; providing a first dielectric layer on the top surface of the substrate to cover the sensing elements; forming a plurality of recesses in the first dielectric layer, the recesses being distributed across the array of sensing elements with a spacing between adjacent ones of the recesses being less than 400 μm; and providing a top hydrophobic layer on the first layer, in the recesses and between the recesses.

The recesses may advantageously be formed by removing material from said first dielectric layer. Such removal of material may be carried out using any suitable method known to one of ordinary skill in the art, such as for example using etching or laser ablation. Forming the recesses through removal of material from the first dielectric layer may be particularly advantageous when manufacturing a fingerprint sensing device in which the recesses are at least 5 μm deep from the top surface of the first dielectric layer.

Effects and features of this second aspect of the present invention are largely analogous to those described above in connection with the first aspect of the invention.

Further features of, and advantages with, the present invention will become apparent when studying the appended claims and the following description. The person skilled in the art realize that different features of the present invention may be combined to create embodiments other than those described in the following, without departing from the scope of the present invention.

BRIEF DESCRIPTION OF THE DRAWINGS

These and other aspects of the present invention will now be described in more detail with reference to the appended drawings showing an example embodiment of the invention, wherein.

DETAILED DESCRIPTION OF PREFERRED EMBODIMENTS OF THE INVENTION

In the present detailed description, various embodiments of sensing device according to the present invention are mainly discussed with reference to capacitive fingerprint sensing device. It should be noted that this by no means limits the scope of the present invention which is equally applicable to other types of sensing devices such as an RF-sensing device. Furthermore, various embodiments of the present invention may also be used in touch screen applications such as smart phones, tablet computers etc.

Figure 1:
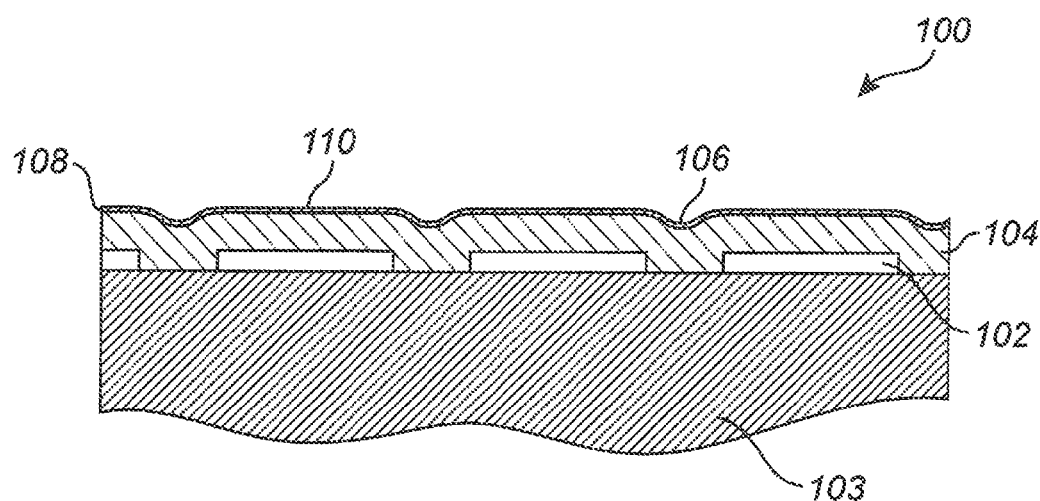
FIG. 1 schematically illustrates a sensing device according to an embodiment of the invention.

FIG. 1 is a schematic illustration of a sensing device 100 comprising a plurality of sensing elements 102 in the form of conductive plates arranged on a substrate 103, a first layer 104 arranged to cover the sensing elements 102, wherein the first layer 104 comprise a plurality of recesses 106. The sensing elements are typically quadratic having a size of around 50 μm. As is readily realized by a person skilled in the art, the size of the sensing element may be different depending on the particular application for which they are to be used. The recesses have a depth of about 3-10 μm and a width of about 10 μm. Furthermore, a second layer 108 is arranged on top of the first layer 104. The first layer 104 is a dielectric material to provide a capacitive coupling between an object placed on the sensing surface 110 and each sensing element 102. The second layer may for example have a thickness of approximately 100 nm. However, the second layer may also be considerably thicker, such as for example up to several tens of microns. The second layer 108, which may also be referred to as a top layer or a coating, at least has hydrophobic surface properties and preferably also oleophobic surface properties in order to repel contaminants from the sensing surface 110. Contaminants may for example comprise sweat, grease or dirt coming from the finger of a user or from the surrounding environment. The fingerprint sensing device 100 also comprises readout circuitry (not shown) for connected to each sensing element 102 such that the capacitive coupling between an object placed on the sensing surface 110 and each sensing element 102 can be determined and read by an external device or application.

Figure 2A:
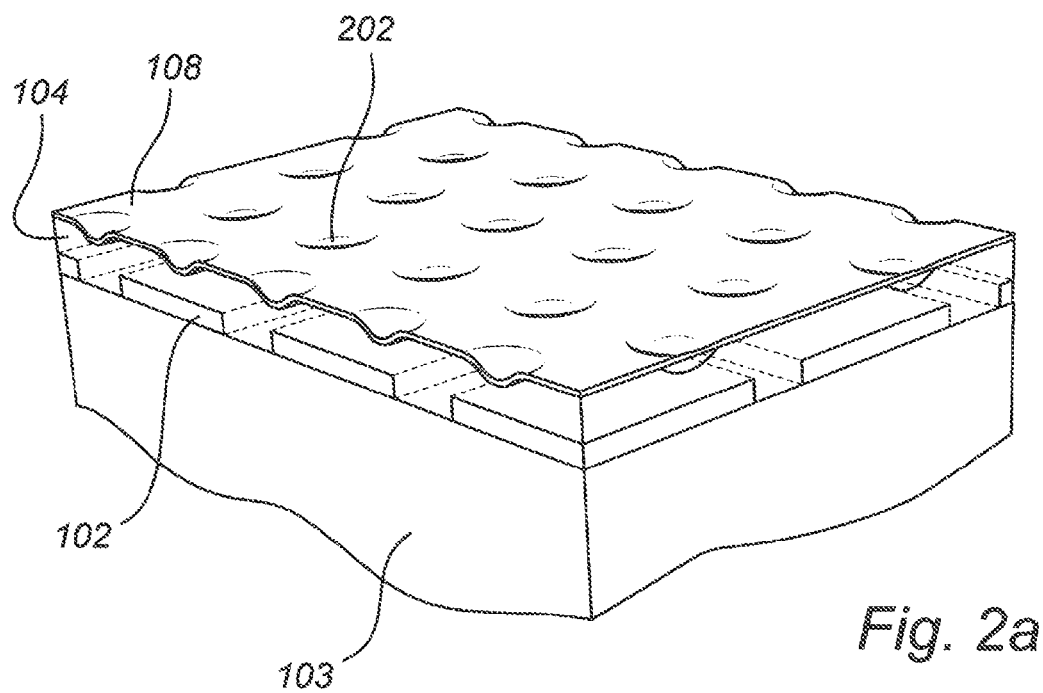
FIGS. 2a-d schematically illustrate various embodiments of a sensing device according to the present invention.

FIG. 2a schematically illustrates a sensing device where the recesses 202 are provided in the form of regularly distributed circular recesses 202. The recesses may also be randomly or pseudo-randomly distributed. As long as the distance between adjacent recesses does not exceed a certain length, the recesses may effectively act to prevent the formation of a continuous film of a contaminant, thereby reducing the occurrence of short circuits between adjacent sensing elements.

Figure 2B:
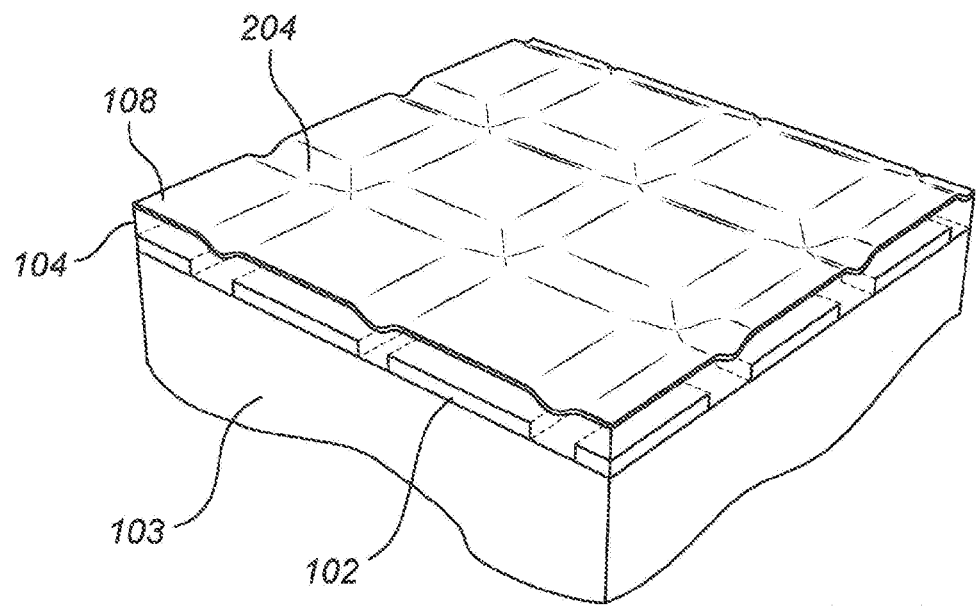

FIG. 2b schematically illustrates a sensing device where the recesses 204 are provided in the form of elongated grooves or trenches aligned with the boundaries between adjacent sensing elements 102.

Figure 2C:
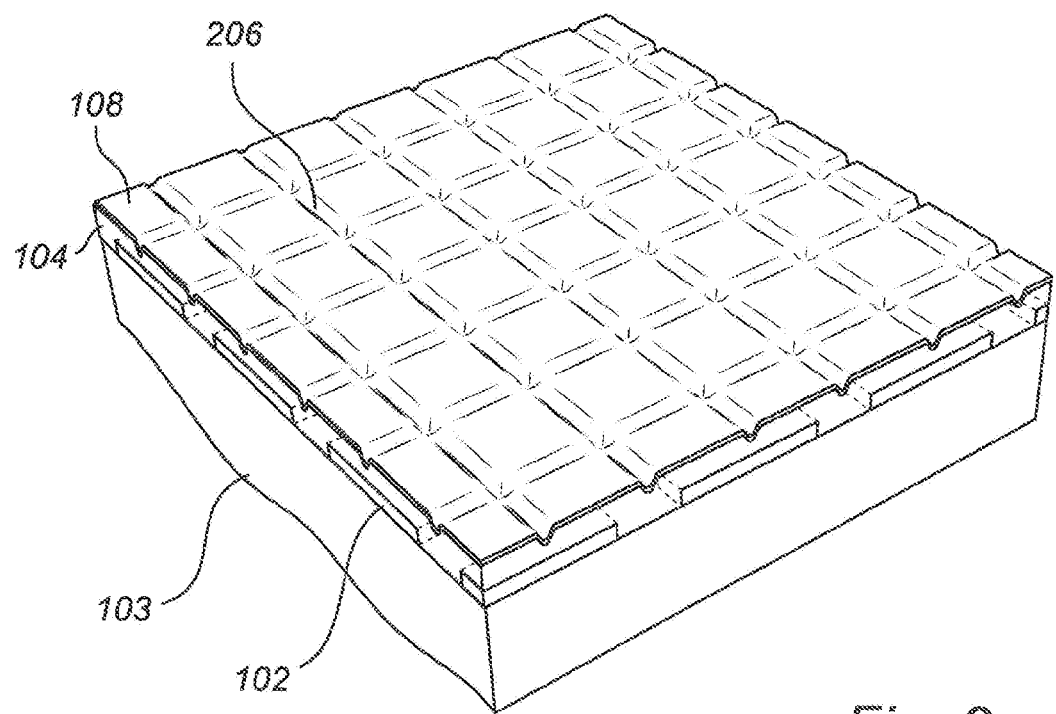

FIG. 2c schematically illustrates a sensing device where the recesses 206 are provided in the form of elongated grooves or trenches which are both arranged to be aligned with the boundaries between adjacent sensing elements 102 as well as intersecting the sensing elements 102.

Figure 2D:
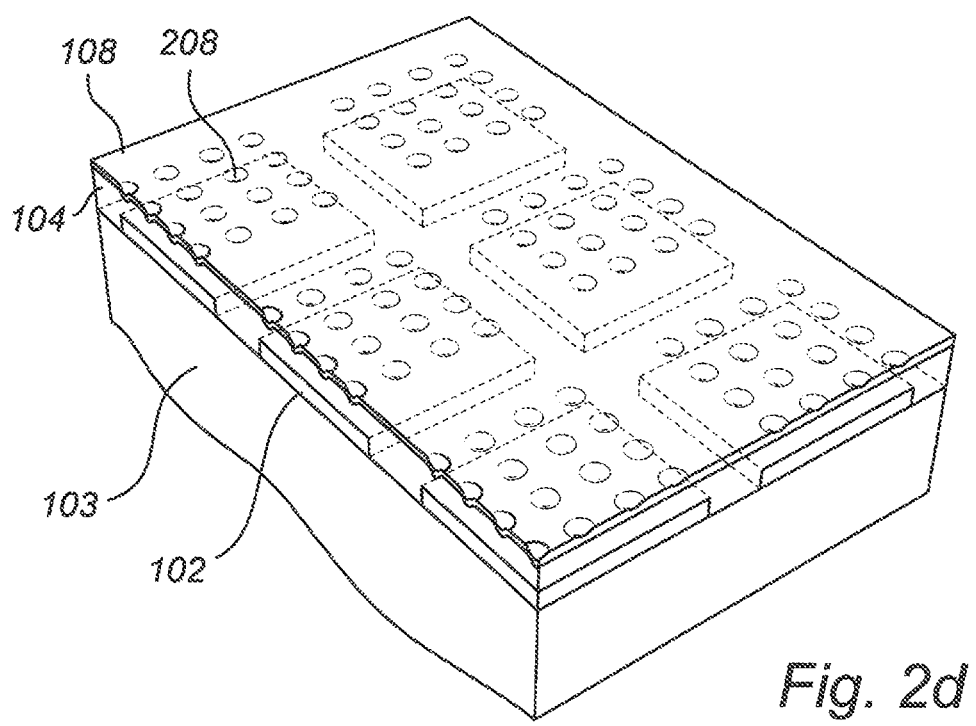

FIG. 2d schematically illustrates a sensing device where the recesses 208 are provided in the form of circular recesses arranged in a 3×3 regular array on top of each sensing element.

The person skilled in the art realizes that endless variations of the configuration of the recesses may be used, while still achieving a purpose of various embodiments the invention which is to prevent the formation of continuous films of contaminants across boundaries of sensing elements. For example, the illustrated patterns may be inverted such that what is now seen as a recess will be a peak, or the different patterns may be combined in various ways.

Figure 3:
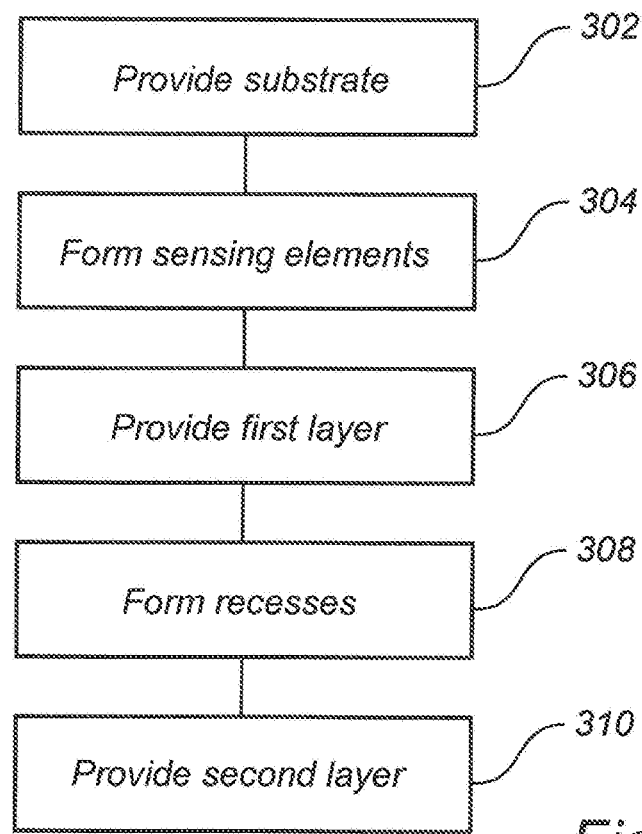
FIG. 3 is a flow chart outlining the general steps of a method according to an embodiment of the invention.

FIG. 3 is a flow chart outlining the general steps of a method or manufacturing a sensing device according to an embodiment of the invention. First 302, with further reference to FIG. 1, a substrate 103 is provided, it is assumed that readout circuitry has already been formed on the substrate 103. Next 304, a suitable arrangement of sensing elements 102 is formed. The sensing elements 102 typically comprise conductive metal plates. The metal layer used for forming the sensing elements can for example be deposited by sputtering or evaporation, and pattering is typically performed using photolithography. After that, a first layer 104 in the form of a dielectric material is provided 306 covering the sensing elements 102. In the dielectric layer 104, recesses 106 are formed 308, for example according to any of the aforementioned configurations. The recesses may be formed by wet or dry etching. In the final step 310, a second layer 108 is provided in the form of a hydrophobic coating.

Figure 4:
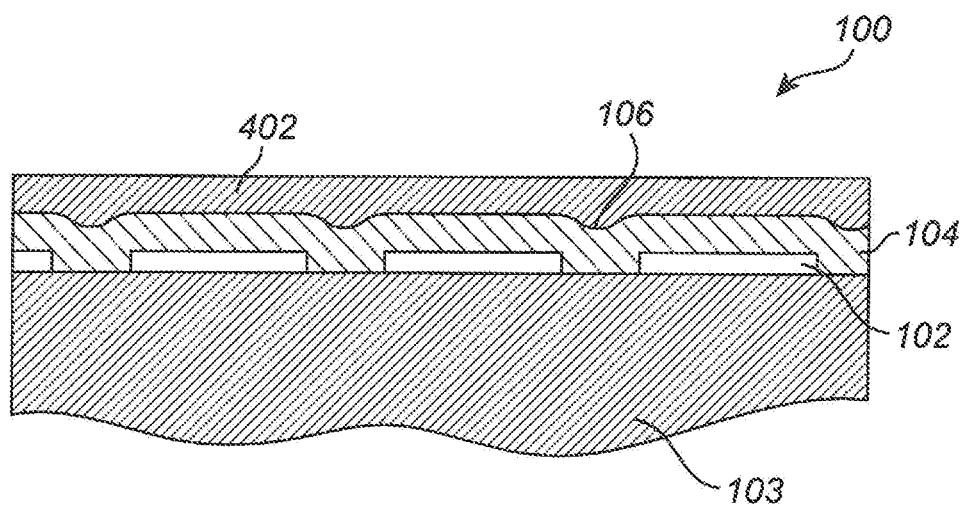
FIG. 4 schematically illustrates a sensing device according to an embodiment of the invention.

FIG. 4 is a schematic illustration of a cross section of a sensing device where the second layer 402 is substantially thicker compared to as illustrated in FIG. 1. By using a thicker second layer 402, a planar sensing surface can be provided.

It is assumed that the substrate is a silicon substrate and that conventional materials are used in the manufacturing method. Accordingly, the methods steps of depositing and patterning metallic and dielectric layers are all well known to the person skilled in the art, and therefore not described in further detail.

Even though the invention has been described with reference to specific exemplifying embodiments thereof, many different alterations, modifications and the like will become apparent for those skilled in the art. Also, it should be noted that parts of the system may be omitted, interchanged or arranged in various ways, the sensing device yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A fingerprint sensing device comprising:
   an array of sensing elements, each of said sensing elements being configured to provide a signal indicative of an electromagnetic coupling between said sensing element and a finger placed on a surface of the fingerprint sensing device;
   a first dielectric layer arranged to cover said array of sensing elements, said first dielectric layer comprising a plurality of recesses at a top surface of the first dielectric layer, said recesses being distributed across said array of sensing elements with a spacing between adjacent ones of said recesses being less than 400 μm; and
   a top hydrophobic layer arranged on said top surface of the first dielectric layer, in said recesses and between said recesses, to provide said surface of the fingerprint sensing device on which said finger is placed, such that when said top hydrophobic layer is worn away through use of said fingerprint sensing device, hydrophobic material will remain in said recesses where it is protected from wear and tear.

2. The fingerprint sensing device according to claim 1, wherein said first dielectric layer is more abrasion resistant than said top hydrophobic layer.

3. The fingerprint sensing device according to claim 1, wherein a thickness of said top hydrophobic layer is smaller than a maximum depth of each of said recesses.

4. The fingerprint sensing device according to claim 1, wherein a depth of each of said recesses is at least 5 μm.

5. The fingerprint sensing device according to claim 1, wherein each of said recesses extends partially through said first dielectric layer without penetrating through the first dielectric layer.

6. The fingerprint sensing device according to claim 1, wherein a thickness of said first dielectric layer is at least 50 μm.

7. The fingerprint sensing device according to claim 1, wherein each of said recesses has a substantially circular cross-section in a plane parallel to said surface of the fingerprint sensing device on which said finger is placed.

8. The sensing device according to claim 1, wherein said recesses are provided in the form of a plurality of elongated grooves, each groove extending at least a distance corresponding to a side of one of said sensing elements.

9. The sensing device according to claim 1, wherein said recesses are arranged in alignment with boundaries between adjacent ones of said sensing elements.

10. The sensing device according to claim 9, wherein said recesses are provided as a grid of continuous grooves extending across said fingerprint sensing device, said grooves being aligned with boundaries between said sensing elements.

11. The sensing device according to claim 1, wherein a minimum width of each of said recesses is at least 10 μm.

12. The sensing device according to claim 1, wherein said top hydrophobic layer additionally has oleophobic surface properties.

13. The sensing device according to claim 1, wherein a thickness of said top hydrophobic layer is less than 100 nm.

14. A method for manufacturing a fingerprint sensing device, said method comprising:
   providing a substrate comprising a plurality of sensing elements on a top surface of said substrate;
   providing a first dielectric layer on the top surface of said substrate to cover said sensing elements;
   forming a plurality of recesses in said first dielectric layer, said recesses being distributed across said plurality of sensing elements with a spacing between adjacent ones of said recesses being less than 400 μm; and
   providing a top hydrophobic layer on said first dielectric layer, in said recesses and between said recesses.

15. The method according to claim 14, wherein said recesses are formed by removing material from said first dielectric layer.

\* \* \* \* \*